United States Patent [19]

Johnson

[11] Patent Number: 5,053,649
[45] Date of Patent: Oct. 1, 1991

[54] METHOD AND APPARATUS FOR HIGH SPEED PHASE DETECTION

[75] Inventor: Howard W. Johnson, Sunnyvale, Calif.

[73] Assignee: Ultra Network Technologies, San Jose, Calif.

[21] Appl. No.: 625,634

[22] Filed: Dec. 6, 1990

Related U.S. Application Data

[63] Continuation of Ser. No. 287,720, Dec. 21, 1988, abandoned.

[51] Int. Cl.⁵ .......................... H03K 5/26; H03K 9/06
[52] U.S. Cl. .................................... 307/514; 307/262; 328/133; 328/155; 331/1 A; 375/120
[58] Field of Search .............. 307/514, 519, 471, 479, 307/262; 328/55, 56, 133, 134, 155, 109, 110; 331/1 A, 25; 375/81, 94, 96, 119, 120; 364/728

[56] References Cited

U.S. PATENT DOCUMENTS

| | | | |
|---|---|---|---|
| 4,071,903 | 1/1978 | Head et al. | 364/728.07 |
| 4,380,815 | 4/1983 | Clendening | 328/133 |
| 4,400,667 | 8/1983 | Belkin | 331/1 A |
| 4,412,340 | 10/1983 | Bartlett et al. | 364/728.07 |
| 4,504,791 | 3/1985 | Conway et al. | 328/56 |
| 4,535,459 | 8/1985 | Hogge, Jr. | 375/120 |
| 4,628,271 | 12/1986 | Takayama | 329/309 |
| 4,628,282 | 12/1986 | Hikawa et al. | 328/133 |
| 4,713,830 | 12/1987 | McDonald | 375/120 |
| 4,797,585 | 1/1989 | Segawa et al. | 328/55 |

*Primary Examiner*—Timothy P. Callahan
*Attorney, Agent, or Firm*—Blakely, Sokoloff, Taylor & Zafman

[57] ABSTRACT

A phase detector particularly suited for high speed, digital data. The data is auto-correlated with the data shifted through a flip-flop where the flip-flop is clocked by the clocking signal. The data is also delayed by one period by an analog delay line. The output of the flip-flop is auto-correlated with the data and with the data shifted by one period to provide an error signal for a VCO. Ordinary ECL circuits in leaded packages may be employed with data rates in the 300 MHz range.

18 Claims, 5 Drawing Sheets

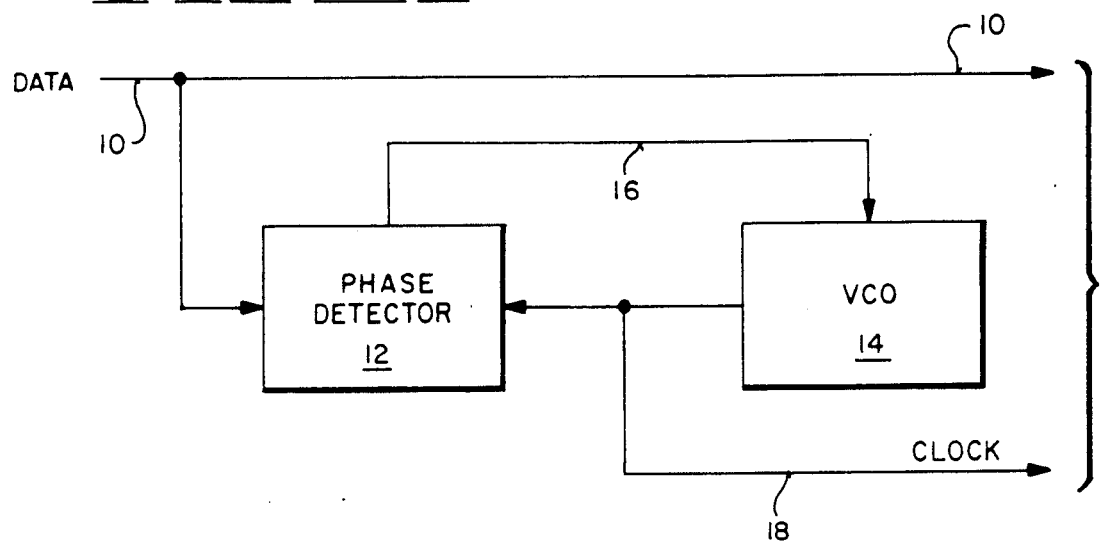
FIG_1
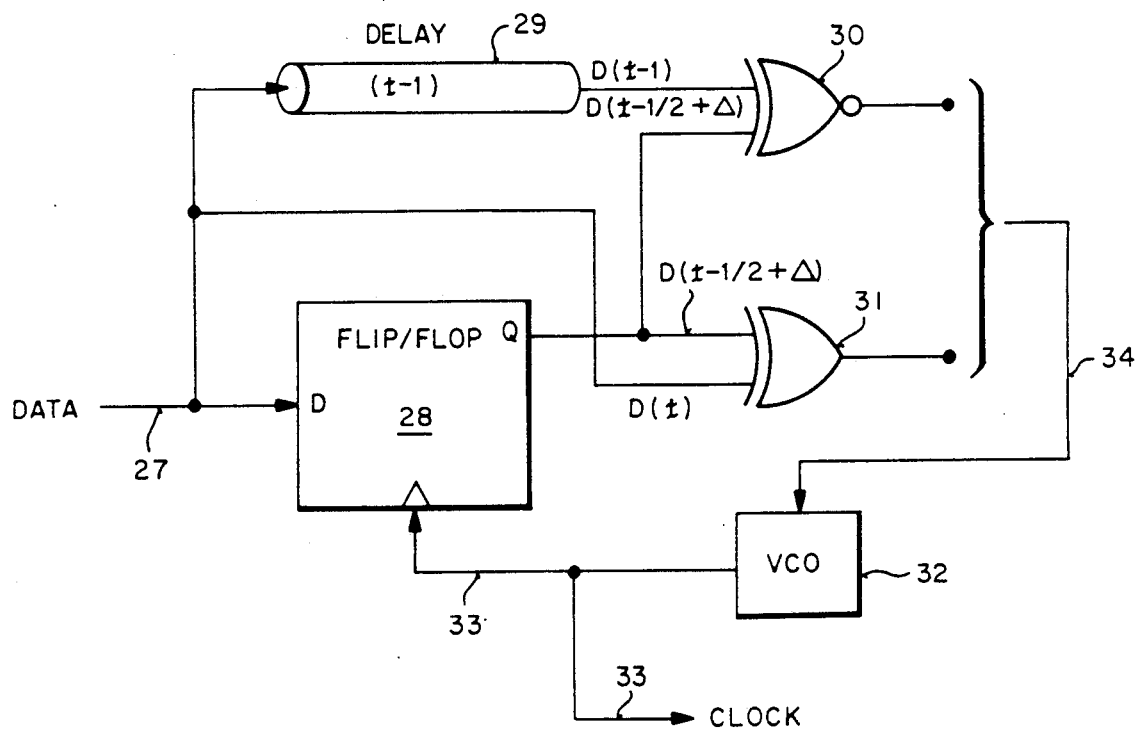
FIG_2

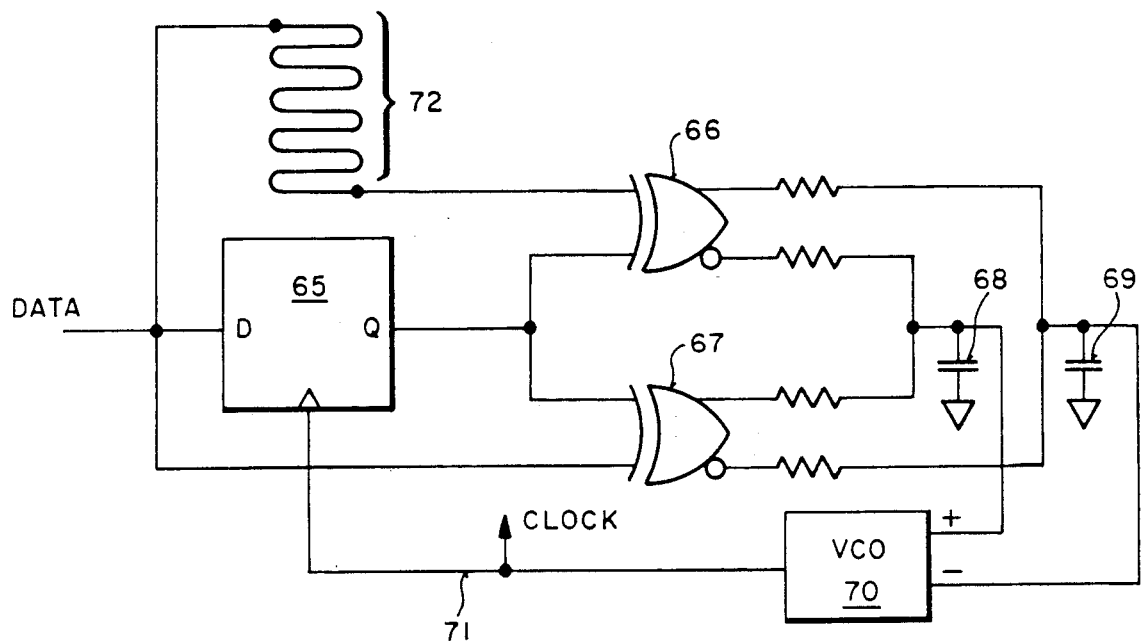
FIG_3
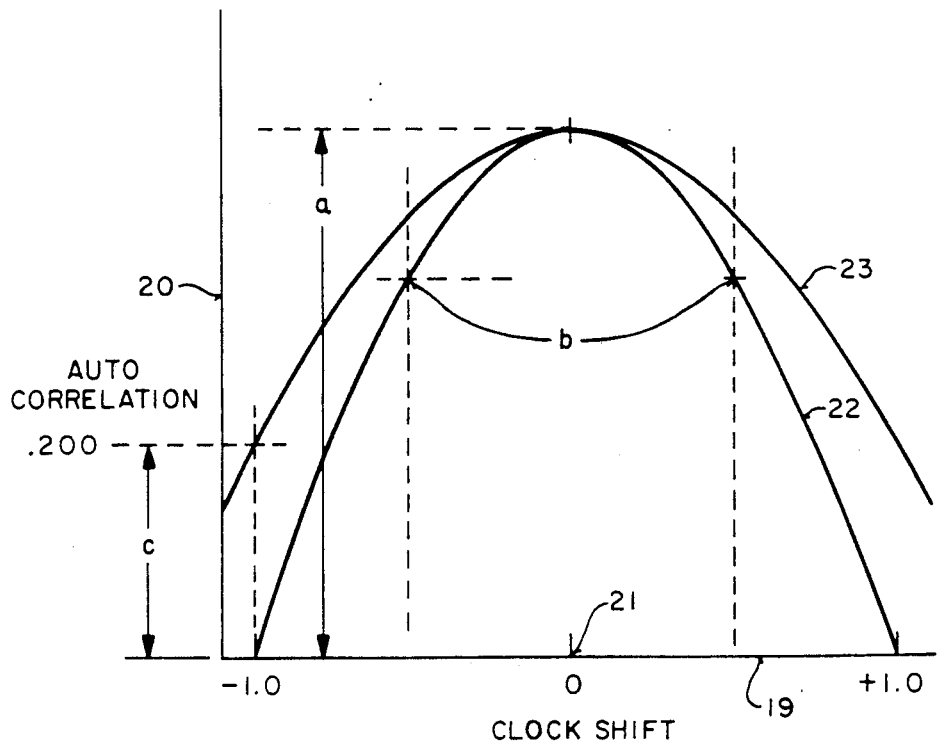
FIG_4

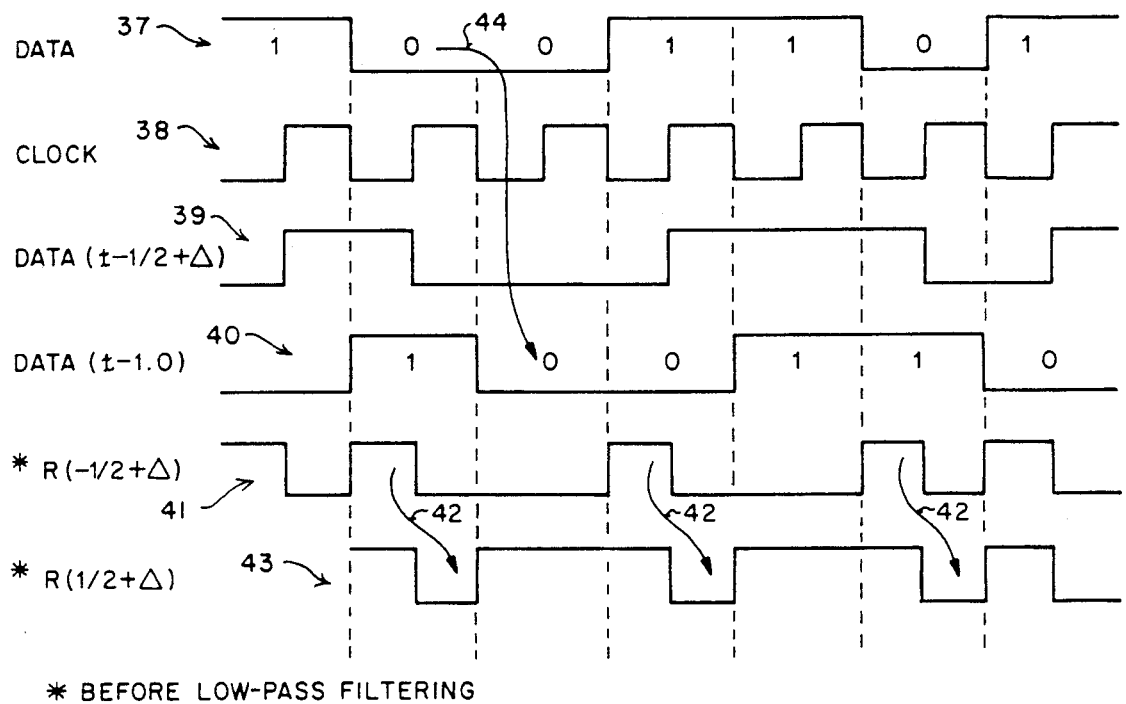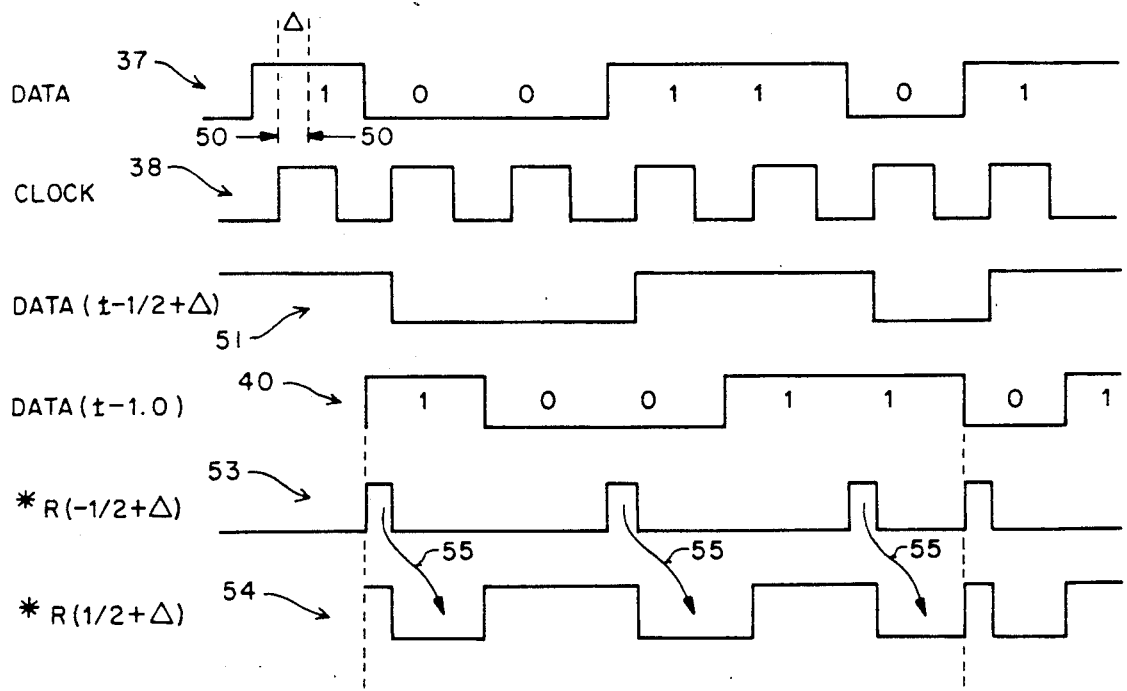

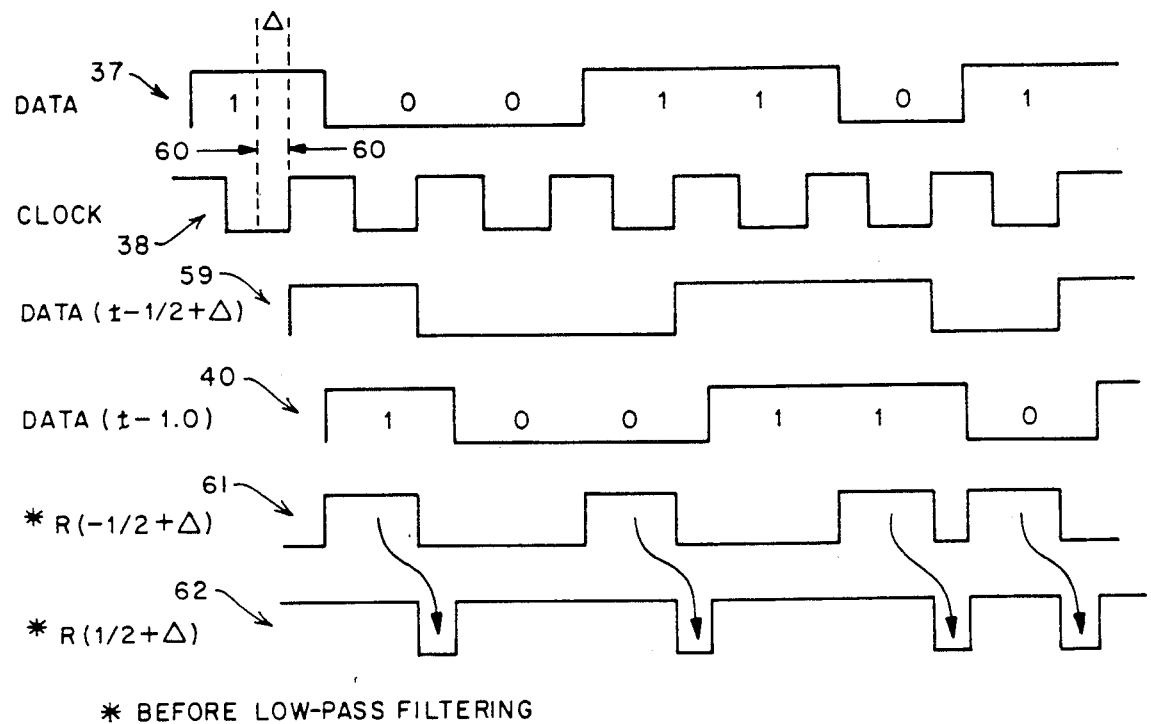
FIG_7
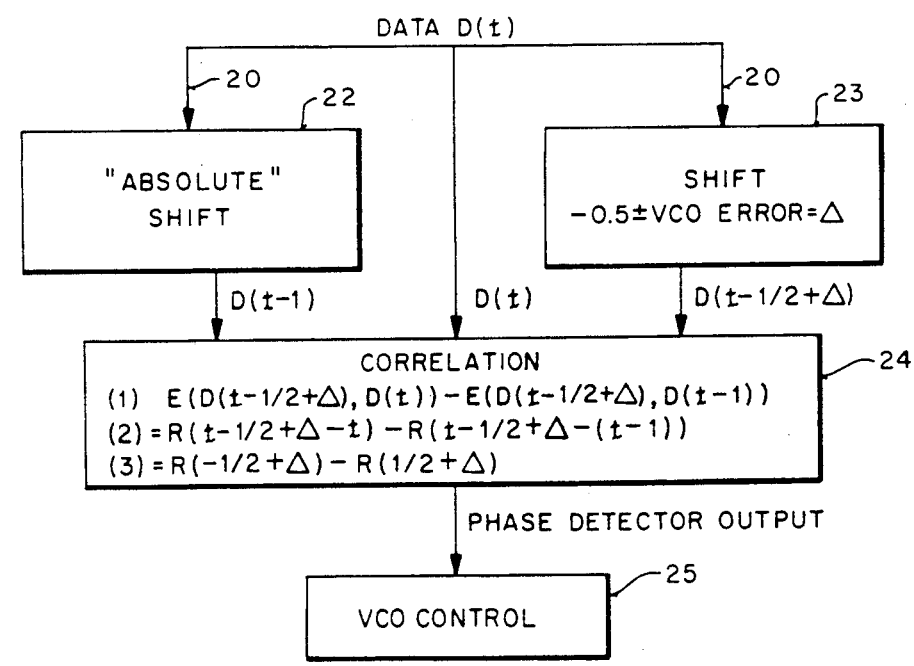
FIG_8

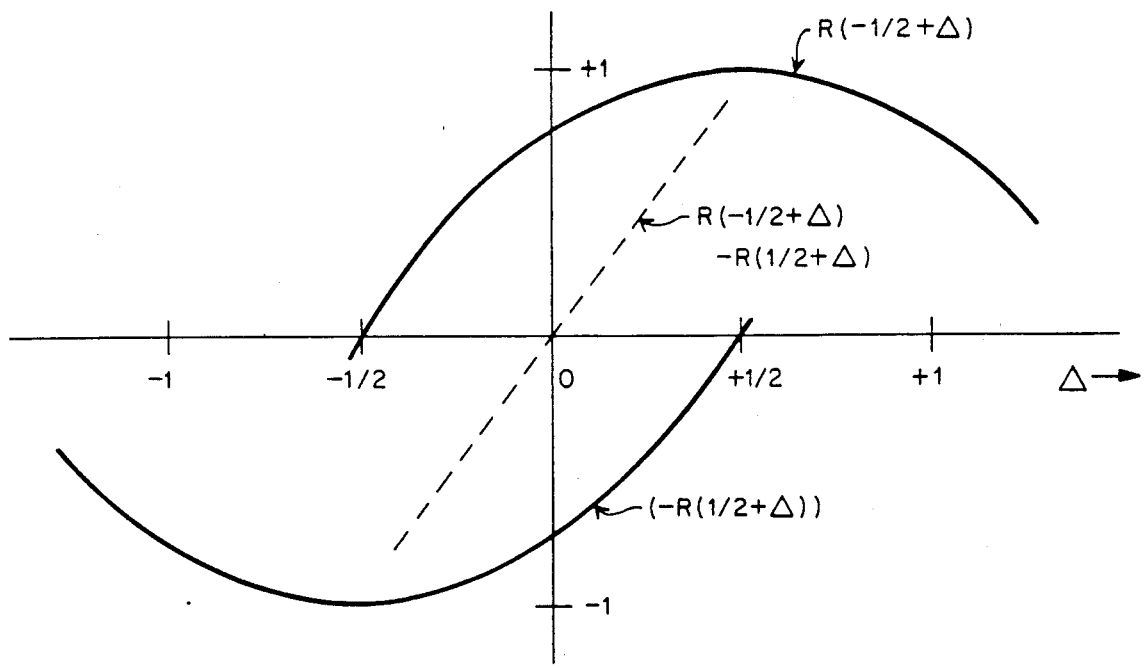
FIG_9
(ASSUMES RANDOM DATA)

METHOD AND APPARATUS FOR HIGH SPEED PHASE DETECTION

This is a continuation of application Ser. No. 07/287,720, filed on Dec. 21, 1988, now abandoned of Howard W. Johnson for Method and Apparatus for High Speed Phase Detection.

BACKGROUND OF THE INVENTION

1. Field of the Invention

The invention relates to the field of phase detectors, particularly those used for detecting the phase difference between a voltage controlled oscillator and a serial, digital stream of data.

2. Prior Art

Numerous circuits are well-known for detecting the phase relationship between two signals. In one common application, digital data is serially transmitted over a line without the transmission of a separate clocking signal. In effect, the clocking signal is recovered from the data stream. Typically, a receiver includes a voltage controlled oscillator (VCO) which has an oscillator tuned to the frequency of the data (data rate). The phase of a clocking signal from the VCO is compared with the phase of the data and the difference in phase provides an error signal for adjusting the frequency/phase of the VCO. The clocking signal provided by the VCO is used to recover the data from the data stream.

There are many well-known and widely used phase detecting circuits which provide a signal representing the phase difference between the incoming data stream and the clocking signal. Typically these circuits have or need a frequency response four times greater than that of the data rate. The four canonical data receiving loops (Squaring, Remodulator, Inverse Modulator, and Costas) all have paths through which data must pass which traverse two multipliers. At each multiplication stage the required circuit bandwidth doubles, resulting in an overall fourfold increase in signal bandwidth. (See *Phaselock Techniques*, Second Edition, by Floyd M. Gardner, Ph. D., published by John Wiley & Sons, pages 218-221). Where data is transmitted at a high rate (for instance, at 300 MHz or above) it is difficult to fabricate an ordinary circuit (i.e., constructed of available IC's in leaded packages soldered to a substrate) which has a frequency response of 1.2 GHz. (The present invention requires a maximum frequency response only twice that of the data.)

One prior art technique used to circumvent the need for this very high frequency response (generally used for data rates above 100 megabits/second) employs a surface acoustic wave (SAW) filter. While these filters provide good performance, they are quite expensive. As will be seen, the present invention provides a high frequency phase detector and method of detection for frequencies generally reserved for SAW filters, however, by employing more ordinary circuits.

SUMMARY OF THE INVENTION

A method and apparatus for detecting the phase error between a clocking signal and a data stream is described. The maximum frequency response required internal to the apparatus is twice that of the data. In one embodiment, a first circuit means (e.g., ECL flip-flop) is used to shift the incoming data stream by a first period which is a function of the phase relationship between the clocking signal and the data stream. A second circuit means (e.g., analog delay line) is used to shift the data stream by a predetermined fixed period. Correlation means (e.g., exclusive OR gates) are used to correlate the output from the first circuit means with the output of the second circuit means and with the data stream. The results of these correlations provide an error signal which is used to control a VCO in a phase locked loop.

BRIEF DESCRIPTION OF THE DRAWINGS

FIG. 1 is a block diagram used generally to show an application for the present invention.

FIG. 2 is a circuit diagram illustrating an embodiment of the present invention.

FIG. 3 is a circuit diagram illustrating the currently preferred embodiment of the present invention.

FIG. 4 is a graph used to show the relationships between auto-correlated signals.

FIG. 5 illustrates waveforms for the condition when the clocking signal is in phase with the data stream; this figure is used to describe the operation of the circuits of FIGS. 2 and 3.

FIG. 6 illustrates waveforms for the condition when the clocking signal is out of phase with the data stream in a first direction; this figure is used to describe the operation of the circuits of FIGS. 2 and 3.

FIG. 7 illustrates waveforms for the condition when the clocking signal is out of phase with the data stream in a second direction; this figure is used to describe the operation of the circuits of FIGS. 2 and 3.

FIG. 8 is a series of blocks used to describe the method of the present invention.

FIG. 9 is a graph used to store the relationship between auto-correlated signals.

DETAILED DESCRIPTION OF THE PRESENT INVENTION

A method and apparatus for detecting the phased error between a clocking signal and a data stream where the data in the data stream has a predetermined, fixed period. In the following description numerous specific details are set forth such as specific circuits, part numbers, etc., in order to provide a thorough understanding of the present invention. It will be obvious, however, to one skilled in the art that the present invention may be practiced without these details.

USE OF THE CURRENTLY PREFERRED EMBODIMENT OF THE INVENTION

The currently preferred embodiment of the invention is used in a data recovery apparatus which receives one or more serial streams of digital data. The data is, for example, transmitted at a fixed clock rate over a line 10 shown in FIG. 1. A receiver is used to detect the data. This detection, as is well-known, requires the recovery of a clocking signal from the data stream. Most often a voltage controlled oscillator (VCO), such as VCO 14, operates at a nominal frequency corresponding to the data rate. A clocking signal from the VCO 14 is compared with the incoming data stream on line 10 by a phase detector 12. The difference in phase between the phase of a clocking signal and the phase of the incoming data provides an error signal on line 16 which is coupled to the VCO 14. This signal causes the clocking signal from the VCO to become and remain in phase with the data. The clocking signal from VCO 14 is then used to identify each bit of data on line 10 in the receiver.

The present invention provides a phase detector which can be used as phase detector 12 in FIG. 1. As will be seen in the currently preferred embodiment ordinary ECL circuits in leaded packages, soldered to a substrate are used to fabricate the phase detector. The phase detector operates with a clocking signal and data rate having a frequency of 312.5 MHz in the currently preferred embodiment.

PRINCIPLE AND METHOD OF OPERATION

The present invention makes use of the fact that when a signal is correlated with itself (auto-correlated) it will have a certain value. For example, when a data stream is coupled to both terminals of an exclusive NOR gate the output of the gate remains high. If the data stream is shifted by one period and again correlated with itself, the result will be half high and half low, a mathematical correlation of zero (if the data is truly random). With the present invention this is what occurs except that a clocking signal from a voltage controlled oscillator (VCO) is used to control the incoming data and, in effect, shift it. If the clocking signal is precisely in phase with the phase of the data the result of the correlation, as will be seen, prevents the generation of an error signal. As the clocking signal shifts so that it either leads or lags the phase of the data, the results of the correlation provide a signal which can be used to adjust the phase of the clocking signal.

Referring to FIG. 4, in the graph "clock shift", that is, the phase difference between a clocking signal and the data stream is plotted along the abscissa 19. The clock shift varies from −1 on the lefthand side of the graph, to 0 at point 21 and finally to +1 on the righthand side of the graph. (As will be seen, since the curves 22 and 23 are symmetrical for purposes of explanation it is not necessary to discuss whether the shift is taken relative to the clocking signal or data stream.) Along the ordinate 20 the auto-correlation value is plotted for the data. The curve 22 is symmetrical about the zero clock shift. For truly random data, the auto-correlation value is zero for either the +1 or −1 clock shift. The curve 22 represents "ideal conditions" where the data is truly random.

Data typically is not random and often long strings of ones or zeroes are transmitted. Most often the data is encoded so the clocking information can be recovered even when strings of ones or zeroes are transmitted. In the currently preferred embodiment, ANSI standard X3T9.5 4B/5B coding is used to encode the data. That is, for each four bit combination of ones and zeroes a unique five bit pattern is used. Bit patterns of all ones or all zeroes are not used. Therefore, even when all ones or zeroes are represented by the encoded data stream, the data stream continues to have transitions. This tends to "randomize" the data from the standpoint of the phase detector. In FIG. 4, the curve 23 illustrates the auto-correlation value for the least random possible data stream generated by the four-of-five encoded data. Even if all ones or zeroes are transmitted, at the clock shift of +1 or −1 the value "c" exists for the auto-correlation where "c" of the 4B/5B encoded data is equal to 0.200.

It should be noted that the curves 22 and 23 are symmetrical about the zero clock shift, as mentioned. This is important since it permits the generation of an error signal which signal can be used to correct a VCO. The values "b" illustrate that for the same absolute phase shift the auto-correlation value will be the same (independent of the direction of the shift).

The method of the present invention is best illustrated in FIG. 8 where steps of the method are shown as blocks. Encoded data is shown as D (t). The data is coupled to both blocks 22 and 23 as indicated by lines 20. Block 22 represents that the data is shifted by one period where the period corresponds to the period of the data. This is shown as an "absolute" shift indicating that this shift is not a function of the clocking signal. Data shifts provided by block 22 is illustrated mathematically as D(t−1). Another shift is performed as represented by block 23. Here the data is shifted by half a period (because a flip-flop is used as will be seen) and additionally a shift occurs which is a function of the difference between the phase of the clocking signal and the phase of the incoming data. These two shifts are shown as $-\frac{1}{2}+\Delta$. The resultant data is illustrated mathematically in FIG. 8 as $D(t-\frac{1}{2}+\Delta)$.

The data and the resultant shifts that result from practicing the steps represented by both blocks 22 and 23 are correlated as indicated by block 24. In effect, the $D(t-\frac{1}{2}+\Delta)$ is correlated both with the data itself and the data resulting from the "absolute" one period shift. The difference between these two correlations provides a signal which is used to control the VCO as indicated by block 25. ("R" is the autocorrelated function for "$\Delta$"; E is the expectation operator.)

FIG. 9 shows a plot of the phase detector output expression $R(-\frac{1}{2}+\Delta)-R(\frac{1}{2}+\Delta)$ as a function of $\Delta$. Because the autocorrelation function is always symmetric, the expression in FIG. 9 always passes through zero at the point $\Delta=0$. The slope of the phase detector output at $\Delta=0$ is between 2.0 and +0.8 for 4B/5B encoded data.

EMBODIMENT OF FIG. 2

Referring to FIG. 2 the incoming data on line 27 is coupled to a delay line 29. The delay line provides a delay equal to one period of the data. In the currently preferred embodiment, an analog delay line is employed. The output of the delay line 29 is coupled to one input terminal of the exclusive NOR gate 30. The data is also coupled to the D input of a flip-flop 28. The Q output of the flip-flop 28 is coupled to one input of an exclusive OR gate 31 and the other input terminal of the gate 30. The data line 27 is coupled to the other input terminal of the gate 31. The clocking signal from the VCO 32 (line 33) is coupled to the clocking terminal of the flip-flop 28. Therefore, the data on line 27 is clocked through the flip-flop on the leading edge of the clocking signal.

Gate 31 is used to implement the calculation of $R(-\frac{1}{2}+\Delta)$, and gate 30 is used to implement the calculation of $R(\frac{1}{2}+\Delta)$.

As will be seen, the outputs of the gates 30 and 31 provide signals used by the VCO 32 to correct the phase of the clocking signal from the VCO 32. This is illustrated by line 34.

Referring now to FIG. 5, assume that a data stream represented by waveform 37 is coupled to line 27 of the circuit of FIG. 2. The data stream is shown as consisting of 1001101 (this represents the four-of-five encoded data). The waveform for the clocking signal applied to the flip-flop 28 of FIG. 2 is shown as waveform 38. For the case illustrated in FIG. 5 the leading edge of the clocking signal is shown occurring precisely at the center of each of the data bits. This is a "in-phase condition" for the circuit of FIG. 2. The output at the Q terminal of the flip-flop 28 is shown as waveform 39. For this in-phase condition the waveform 39 is precisely shifted in-phase by a 180 degrees from the waveform 37. That is, the data is shifted by one-half a period. Waveform 40 illustrates the data at the output of the delay line 29 of FIG. 2. The data is simply shifted by one period, and for example, the first zero of waveform 37 is shifted by one cycle as indicated by line 44.

The exclusive OR gate 31 of FIG. 2 performs auto-correlation and correlates the data stream with the data stream shifted by half a cycle for the waveforms of FIG. 5. The resultant waveform at the output of gate 31 is shown as waveform 41. The exclusive NOR gate 30 also performs an auto-correlation and correlates the data shifted by delay line 29 with the data from the flip-flop 28. The output of the gate 30 is shown as waveform 43. If waveforms 41 and 43 are summed and then lowpass filtered, the net signal is midway between the high and low level outputs of the gates. Lines 42 illustrate that the positive going pulses of waveforms 41 are offset by the negative going pulses of waveform 43.

In FIG. 6 the waveform 37 is again duplicated along with the waveform 38 representing the clocking signal. However, this time there is a different phase relationship between these signals as indicated by the arrows 50. Here the leading edge of the clocking signal occurs before the mid-point of the data, that is, the clocking signal is leading the data. Waveform 51 represents the output of the flip-flop 28 for this condition. Note that the data is not simply shifted by one half a period as is the case in FIG. 5 but rather is shifted by one-half a period plus the small negative time represented by the arrows 50. Waveform 40 again illustrates the data shifted by one period; this waveform is the same as that illustrated in FIG. 5 since this shift is not a function of the clocking signal phase. The result of the auto-correlation between the data and the output of the flip-flop 28 (output of gate 31) is shown as waveform 53. The results of the auto-correlation at the output of gate 30 is shown as waveform 54. If these two waveforms are summed and then lowpass filtered, it is apparent that the result will be a more negative signal than resulted for the example of FIG. 5 since the positive going excursions of waveform 53 are of shorter durations than the negative going excursions of waveform 54. This is indicated by the arrows 55. The more negative signal that results from the combining waveforms 53 and 54 is used as the error signal to correct the leading condition of VCO 32 and to bring its output into phase with the data.

Referring to FIG. 7, the data stream 37 is again illustrated along with a clocking signal waveform 38. However, this time the phase relationship between these waveforms is such that the leading edge of the clocking signal lags behind the mid-point of the data by an additional period of time defined by the arrows 60. The output of the flip-flop 28 is shown as waveform 59 for this lagging condition. The output of the delay line is again illustrated and remains waveform 40. The correlation between the data and the output of the flip-flop is shown as waveform 61 (output of gate 31). The results of the correlation performed by gate 30 is shown as waveform 62. When waveforms 61 and 62 are summed, it can be seen that a more positive signal results when compared to the signal from FIG. 5 since the positive going transitions of waveform 61 are greater than the negative going transitions of the waveform 62. These signals will drive the VCO in a direction opposite to that produced by waveforms 53 and 54. This corrects the VCO 32 and tends to bring the clocking signal into phase with the data.

CURRENTLY PREFERRED EMBODIMENT OF THE INVENTION

The presently preferred embodiment of the invention is illustrated in FIG. 3. The data is coupled to a D terminal of a flip-flop 65. This flip-flop is a Motorola Part No. MC1690 in the currently preferred embodiment. The clocking terminal of this flip-flop is coupled to a VCO 70 and receives a clocking signal on line 71. The Q output from the flip-flop 65 is coupled to one input of exclusive OR gate 66 and one input of exclusive OR gate 67. These OR gates in the currently preferred embodiment are both packaged in a single package and sold by Motorola as Part No. 10H107. Both the flip-flop 65 and gates 66 and 67 employ emitter-coupled logic circuits, in the currently preferred embodiment.

In the currently preferred embodiment the delay line is realized as a copper line formed as a serpentine etched pattern. Ordinary photolithographic technology is used to form the line 72 on a substrate of FR-4 epoxy glass laminate. In the currently preferred embodiment, the line is formed from copper. Where the data rate after encoding is 312.5 MHz a delay of approximately 3.2 nanoseconds is required. Considering the speed of light in copper, line 72 for this embodiment is approximately 20 inches. Note several delay lines, each of different lengths, may be fabricated on a single substrate and each used for a different delay where different data rates are used. Thus, in the currently preferred embodiment, the analog delay used to delay the digital data is realized as an ordinary copper line. It should be noted that the delay through this line is quite precise since its length may be easily controlled with current photolithographic technology.

The true output from gate 67 and the complementary output from gate 66 are coupled to a capacitor 68 through resistors. Similarly, the true output from gate 66 and the complementary output from gate 67 are coupled to a capacitor 69 through resistors. The signals integrated on capacitors 68 and 69 provide a "push-pull" like drive to control the VCO 70. The operation of and waveforms associated with the circuit of FIG. 8 are the same in substance as those described for the previous embodiment of FIG. 2.

Thus, a phase detector has been described which employs an analog delay and ordinary ECL circuits to provide phase detection of signals in the 300 MHz range.

I claim:

1. An apparatus comprising:
   clock generation means for generating a clock signal;
   first circuit for receiving and shifting a data stream by a first period which is a function of the phase relationship between said clocking signal and said data stream, said first circuit means coupled to receive said data stream and said clocking signal;
   second circuit means for shifting said data stream by a period corresponding to a period of data in said data stream, said second circuit means being coupled to receive said data stream, and to provide as an output a shifted data stream; and
   correlation means for correlating signals coupled to receive signals from said first circuit means and said second circuit means, and coupled to provide a correlated output signal to said clock generation means.

2. The apparatus as defined by claim 1 wherein said second circuit means comprises an analog delay line.

3. The apparatus defined by claim 1 wherein said correlating means correlates said data stream with a first signal from said first circuit means, and correlates said first signal with a second signal from said second circuit means.

4. The apparatus as recited by claims 1 or 3 wherein said correlating means comprises a first Exclusive OR gate coupled to receive signals from said first circuit means and a second Exclusive OR gate coupled to receive signals from said second circuit means.

5. The apparatus defined by claim 1 wherein said first circuit means comprises a flip-flop with said data stream being coupled to the D terminal of said flip-flop and said clocking signal being coupled to the clocking terminal of said flip-flop such that data is clocked through said flip-flop on one of the trailing or leading edges of said clocking signal.

6. In an apparatus for detecting the phase error between a digital clocking signal and a first digital data stream, an improvement comprising:
   an analog delay line coupled to receive said first digital data stream for delaying said first digital data stream by one period of data in said first digital data stream, said analog delay line providing as an output a second data stream delayed from said first data stream;
   first circuit means coupled to receive said first digital data stream and further coupled to receive said digital clock signal, said first circuit means for providing, under the control of said digital clock signal, a third data stream delayed from said first digital data stream; and,
   second circuit means coupled to receive said second data stream and said third data stream for providing a signal representing said phase error.

7. The improvement defined by claim 6 wherein said delay line comprises a metal line of a predetermined length.

8. The improvement defined by claim 7 wherein said metal line is an etched line.

9. The improvement defined by claims 7 or 8 wherein said line has a general serpentine shape.

10. An apparatus for providing a clocking signal in phase with a digital data stream comprising:
    a flip-flop for phase shifting said data stream, said data stream being coupled to an input terminal of said flip-flop and said clocking signal being coupled to the clocking terminal of said flip-flop;
    an analog delay line for providing a delay corresponding to a period of data in said data stream, said delay line being coupled to receive said data stream;
    correlating means for correlating signals coupled to the output of said flip-flop and said delay line and coupled to receive said data stream;
    clock generation means for generating said clocking signal, said clcok generation means coupled to receive an output of said correlation means, said output of said correlation means controlling said clock generation means for providing said clocking signal in phase with said data stream.

11. The apparatus defined by claim 10 wherein said analog delay line comprises a metal line.

12. The apparatus defined by claim 11 wherein said metal line is an etched serpentine line.

13. The apparatus defined by claims 11 or 12 wherein said flip-flop is an emitter-coupled logic circuit.

14. The apparatus defined by claims 10 or 12 wherein said correlating means comprises a pair of exclusive OR gates.

15. The apparatus defined by claim 14 wherein said gates comprise emitter-coupled logic circuits.

16. A method comprising the steps of:
    (a) shifting a data stream by a fixed period corresponding to a period of data in said data stream;
    (b) shifting said data stream by an amount which is a function of the phase relationship between said data stream and a clocking signal;
    (c) correlating the results of steps a and b and said data stream.

17. An apparatus comprising:
    clock generation means for generating a clock signal;
    data communication means for communicating a data stream;
    first circuit for shifting said data stream by a first period which is a function of the phase relationship between said clocking signal and said data stream, said first circuit means coupled to receive said data stream and said clocking signal;
    second circuit means for shifting said data stream by a period N, said period N corresponding to some multiple M of a period of data in said data stream, said second circuit means being coupled to receive said data stream; and
    correlation means for correlating signals coupled to receive signals from said first circuit means and said second circuit means, and coupled to receive said data stream.

18. The apparatus as recited by claim 17 wherein M is 1.

* * * * *